(12) United States Patent
Vakilian et al.

(10) Patent No.: US 6,795,712 B1
(45) Date of Patent: Sep. 21, 2004

(54) SYSTEM FOR ALLOWING A TDMA/CDMA PORTABLE TRANSCEIVER TO OPERATE WITH CLOSED LOOP POWER CONTROL

(75) Inventors: Nooshin D. Vakilian, Irvine, CA (US); Dmitriy Rozenblit, Irvine, CA (US); William J. Domino, Yorba Linda, CA (US); Morten Damgaard, Laguna Hills, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 663 days.

(21) Appl. No.: 09/665,820

(22) Filed: Sep. 20, 2000

(51) Int. Cl.[7] .......................... H04B 7/216; H04B 1/04; H04M 1/00
(52) U.S. Cl. ....................... 455/522; 455/110; 370/335; 370/342
(58) Field of Search ................................ 455/522, 110; 370/18, 342, 335; 330/129

(56) References Cited

U.S. PATENT DOCUMENTS 5,107,487 A * 4/1992 Vilmur et al. .............. 370/342
6,034,952 A * 3/2000 Dohi et al. ................. 370/335
6,438,360 B1 * 8/2002 Alberth et al. ............. 455/110
6,512,931 B1 * 1/2003 Kim et al. .................. 455/522

* cited by examiner

Primary Examiner—William Cumming
(74) Attorney, Agent, or Firm—Needle & Rosenberg, P.C.

(57) ABSTRACT

A closed power control feedback loop system allows a single portable transceiver architecture to be used for systems in which a transmit signal including both a phase modulated (PM) component and an amplitude modulated (AM) component are supplied to a power amplifier and in systems in which the transmit signal has only a PM component supplied to a power amplifier. By injecting the inverse of the AM portion of the desired transmit signal into the closed power control feedback loop, the feedback loop will not cancel the AM portion of the signal, thus allowing a system where both a PM component and an AM component of the transmit signal are present at the output of the power amplifier to function using a closed power control feedback loop.

18 Claims, 3 Drawing Sheets

SYSTEM FOR ALLOWING A TDMA/CDMA PORTABLE TRANSCEIVER TO OPERATE WITH CLOSED LOOP POWER CONTROL

BACKGROUND OF THE INVENTION

1. Technical Field

This invention relates generally to power control in a wireless communication device transmitter, and, more particularly, to a system for allowing a time division multiple access (TDMA)/code division multiple access (CDMA) portable transceiver to operate using a closed loop power control feedback system.

2. Related Art

With the increasing availability of efficient, low cost electronic modules, mobile communication systems are becoming more and more widespread. For example, there are many variations of communication schemes where various frequencies, transmission schemes, modulation techniques and communication protocols are used to provide two-way voice and data communications in a handheld telephone-like communication handset. The different modulation and transmission schemes each have advantages and disadvantages.

As these mobile communication systems have been developed and deployed, many different standards, to which these systems must conform have evolved. For example, in the United States, portable communications systems complying with the IS-136 standard specify the use of a particular modulation scheme and access format. In the case of IS-136, the modulation scheme can be 8-quadrature phase shift keying (8QPSK), offset $\pi/4$ differential quadrature phase shift keying ($\pi/4$ -DQPSK) or variations and the access format is time division multiple access (TDMA). Other standards may require the use of, for example, code division multiple access (CDMA).

Similarly, in Europe, the global system for mobile communications (GSM) standard requires the use of the gaussian minimum shift keying (GMSK) modulation scheme in a narrowband TDMA access environment. Although there are many differences that distinguish systems complying with IS-136 from systems complying with GSM, a substantial difference is the manner in which transmit power is controlled. In IS-136 (TDMA)/CDMA systems, the transmit power control is achieved using a reference voltage control signal supplied to the portable transceiver from the base station with which the portable transceiver is communicating. In this "open loop" feedback control system, the base station sends a reference signal requesting that the portable transceiver either increase or decrease transmit power. In response, the portable transceiver will comply by adjusting the transmit power in predetermined steps of, for example, 2 dB. The base station continues sending the power control adjustment signal until the portable transceiver is supplying an appropriate transmit power level.

In contrast to portable communication systems complying with the IS-136 standard, those systems complying with the GSM standard have a much stricter transmit power control requirement. Instead of having to adjust transmit power in relatively large steps, systems complying with GSM are required to set transmit power at a particular level, with very little variation. In order to achieve this strict transmit power control requirement, systems complying with GSM implement a closed feedback loop power control system. The closed feedback loop power control system measures a portion of the transmit power, compares this transmit power with a reference power level developed within the portable transceiver to develop an error signal and the resulting error signal is fed back to the input of the power amplifier to adjust the transmit power to comply with the reference power level. Importantly, the closed feedback loop resides completely in the transmit portion of the portable communication device.

Furthermore, in a typical GSM mobile communication system using narrowband TDMA technology, a GMSK modulation scheme supplies a very clean phase modulated (PM) transmit signal to a non-linear power amplifier directly from an oscillator. In such an arrangement, a non-linear power amplifier, which is highly efficient, can be used thus allowing efficient modulation of the phase-modulated signal and minimizing power consumption. Because the modulated signal is supplied directly from an oscillator, the need for filtering, either before or after the power amplifier, is minimized. Other transmission standards, such as those employed in IS-136, however, use a modulation scheme where both a PM signal and an amplitude modulated (AM) signal are transmitted. Standards such as these increase the data rate without increasing the bandwidth of the transmitted signal. Unfortunately, existing GSM modulation schemes are not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up and ramp-down of the transmit power as well as have a high degree of control over the output power level over a wide power range. As mentioned above, in GSM this power control is typically performed using a closed feedback loop in which a portion of the signal output from the power amplifier is compared with a reference signal and the resulting error signal is fed back to the input of the power amplifier.

When attempting to include a PM component and an AM component in a GSM type modulation system, the power control loop will tend to fight against the amplitude variations present in the signal while attempting to maintain the desired output power. In such an arrangement, the power control loop tends to cancel the AM portion of the signal.

In systems that transmit signals containing both PM and AM components, the output power can be controlled by setting a calibrated control signal on the power amplifier. Unfortunately, this requires the use of a highly linear, and therefore very inefficient, power amplifier. In non-burst transmission systems the output power may be controlled by a feedback loop having a time-constant that is very low compared to the time-constant of the amplitude variations of the modulator. Another known method to control the output power is to "pre-distort" the modulated signal in such a way that the power control loop will cancel the effect of the pre-distortion. In such a method, the amplitude information is passed through a transfer function that is the inverse of the power control loop transfer function. Unfortunately, these methods are costly and inefficient.

In systems complying with IS-136, transmit power control is achieved via an open loop feedback path in which the base station sends a reference power signal to the portable transceiver. In such a system, there is no specific power requirement, just the command to either increase or decrease power output. This is known as an open loop power control system.

In those transmission standards where both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

With the increasing desirability of developing one worldwide portable communication standard, it would be desirable to allow portable transceivers that comply with the IS-136 standard, and provide both a PM component and an AM component to the transmit signal to operate in a GSM system in which there is typically only a PM component to the transmit signal. Furthermore, as the GSM standard evolves further, such as with the development of enhanced data rates for GSM evolution (EDGE), it is desirable to have one portable transceiver that may operate in all systems. Unfortunately, because the GSM system requires closed loop power control, it is currently not possible to use a portable transceiver complying with the IS-136 standard in a GSM/EDGE mobile communication environment.

SUMMARY

The invention provides a system for allowing a time division multiple access TDMA/CDMA portable transceiver to operate using a closed loop power control feedback system. The invention provides a closed power control feedback loop in a TDMA/CDMA portable transceiver by injecting an inverse version of the AM signal desired at the output of the transmitter into the power control feedback loop. In this manner, a closed feedback loop can be employed in a TDMA/CDMA system without the closed feedback loop canceling the AM portion of the transmit signal.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components in the figures are not necessarily to scale relative to each other, emphasis instead being placed upon clearly illustrating the principles of the invention. Moreover, in the figures, like reference numerals designate corresponding parts throughout the different views.

DETAILED DESCRIPTION

Figure 1:
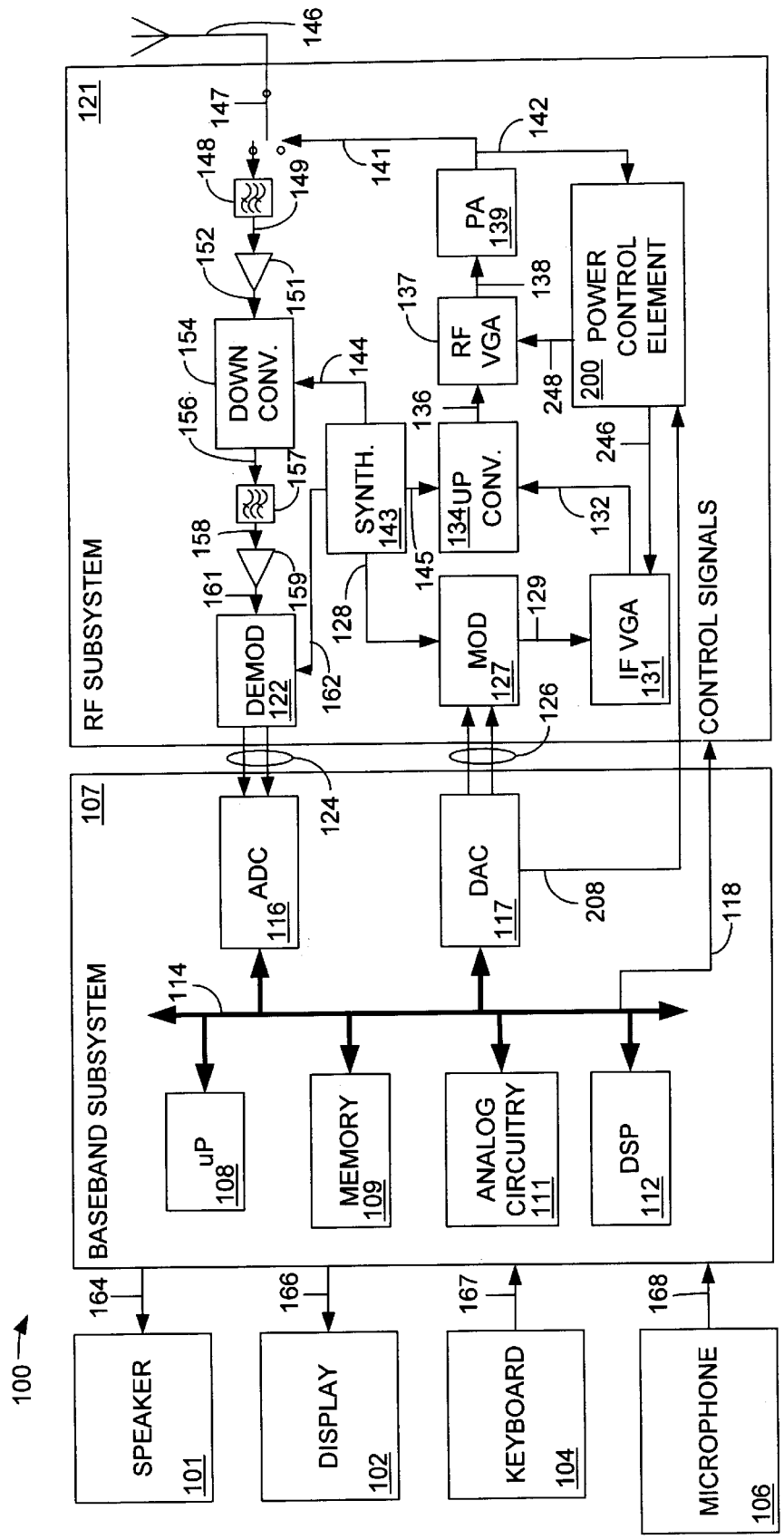
FIG. 1 is a block diagram illustrating a simplified portable transceiver.

Although described with particular reference to a portable transceiver, the closed power control feedback loop system can be implemented in any system in which a combined signal including a PM component and an AM component is supplied to a power amplifier. Furthermore, the closed power control feedback loop system is applicable to any system in which it is desirable to implement a closed power control feedback loop and in which a PM signal and an AM signal are supplied to a linear power amplifier.

The closed power control feedback loop system can be implemented in software, hardware, or a combination thereof. In a preferred embodiment(s), selected portions of the closed power control feedback loop system are implemented in hardware and software. The hardware portion of the invention can be implemented using specialized hardware logic. The software portion can be stored in a memory and be executed by a suitable instruction execution system (microprocessor). The hardware implementation of the closed power control feedback loop system can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The closed power control feedback loop software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100. Portable transceiver 100 includes speaker 101, display 102, keyboard 104, and microphone 106, all connected to baseband subsystem 107. In a particular embodiment, portable transceiver 100 can be, for example but not limited to, a portable telecommunication handset such as a mobile cellular-type telephone. Speaker 101 and display 102 receive signals from baseband subsystem 107 via connections 164 and 166, respectively, as known to those skilled in the art. Similarly, keyboard 104 and microphone 106 supply signals to baseband subsystem 107 via connections 167 and 168, respectively. Baseband subsystem 107 includes microprocessor (uP) 108, memory 109, analog circuitry 111, and digital signal processor (DSP) 112 in communication via bus 114. Microprocessor 108 and memory 109 provide the signal timing, processing and storage functions for portable transceiver 100. Analog circuitry 111 provides the analog processing functions for the signal within baseband subsystem 107 and DAC 117 provides control signals to radio frequency (RF) subsystem 121 via connection 118. Although shown as a single connection 118, the control signals from DAC 117 are supplied to a variety of points within RF subsystem 121. It should be noted that, for simplicity, only the basic components of portable transceiver 100 are illustrated herein.

Baseband subsystem 107 also includes analog-to-digital converter (ADC) 116 and digital-to-analog converter (DAC) 117. ADC 116 and DAC 117 also communicate with microprocessor 108, memory 109, analog circuitry 111 and DSP 112 via bus 114. DAC 117 converts the digital information within baseband subsystem 107 into an analog signal for transmission to RF subsystem 121 via connection 126 and provides a reference voltage power level signal to power control element 200 via connection 208. Connection 126, while shown as two directed arrows, includes the information that is to be transmitted by RF subsystem 121 after conversion from the digital domain to the analog domain.

RF subsystem 121 includes modulator 127, which, after receiving a frequency reference signal from synthesizer 143 via connection 128, modulates the received analog information and provides a modulated signal via connection 129 to intermediate frequency (IF) variable gain amplifier (VGA) 131. The gain of IF VGA 131 is set at a specific level while transmitting. To accomplish this, a wide range of output levels is required, thus necessitating a variable gain amplifier. The output of IF VGA 131 on connection 132 is an IF modulated signal containing both a PM component and an AM component, and is supplied to upconverter 134. Upconverter 134 also receives a frequency reference signal from synthesizer 143 via connection 145. Synthesizer 143 determines the frequency to which upconverter 134 upconverts the modulated signal on connection 132.

Upconverter 134 supplies the fully modulated signal via connection 136 to radio frequency (RF) VGA 137. The RF VGA 137 amplifies the combined modulated PM and AM signal on connection 136 to provide the appropriate power level on connection 138 to power amplifier 139. Power amplifier 139 amplifies the modulated signal on connection 138 to the appropriate power level for transmission via connection 141 to antenna 146. Illustratively, switch 147 controls whether the amplified signal on connection 141 is transferred to antenna 146 or whether a received signal from antenna 146 is supplied to filter 148. The operation of switch 147 is controlled by a control signal from DAC 117 via connection 118.

A portion of the amplified transmit signal on connection 141 is supplied via connection 142 to power control element 200. Power control element 200 forms a closed power control feedback loop and supplies gain control signals on connections 246 and 248 to IF VGA 131 and RF VGA 137, respectively, instructing the amplifiers 131 and 137 as to the correct power level to which the signal should be amplified. The operation of power control element 200 will be described in further detail with respect to FIGS. 2 and 3.

A signal received by antenna 146 will, at the appropriate time determined by DAC 117 and communicated to RF subsystem 121 via connection 118, be directed via switch 147 to receive filter 148. Receive filter 148 will filter the received signal and supply the filtered signal on connection 149 to low noise amplifier (LNA) 151. Filter 148 is a preselect filter which passes only the signal in the receive band, with no attenuation, and rejects any out of band signals. LNA 151 takes the very weak signal on connection 149 and amplifies it to a level at which downconverter 154 can translate the signal from the transmitted frequency to an intermediate frequency (IF). Alternatively, the functionality of LNA 151 and downconverter 154 can be accomplished using other elements, such as, for example but not limited to, a combination of a low noise amplifier (LNA) and an image reject downconverter.

Downconverter 154 receives a frequency reference signal from synthesizer 143, via connection 144, which signal instructs the downconverter 154 as to the proper frequency to which to downconvert the signal received from LNA 151 via connection 152. Downconverter 154 sends the downconverted signal via connection 156 to second receive filter 157. Second receive filter 157 is an IF filter having the same bandwidth as the channel and further filters the downconverted signal and supplies it via connection 158 to amplifier 159. Amplifier 159 amplifies the received signal and supplies the amplified signal via connection 161 to demodulator 122. Demodulator 122 receives a frequency reference signal from synthesizer 143, via connection 162, and recovers the transmitted analog information and supplies a signal representing this information via connection 124 to ADC 116. ADC 116 converts these analog signals to a digital signal at baseband frequency and transfers it via bus 114 to DSP 112 for further processing.

Figure 2:
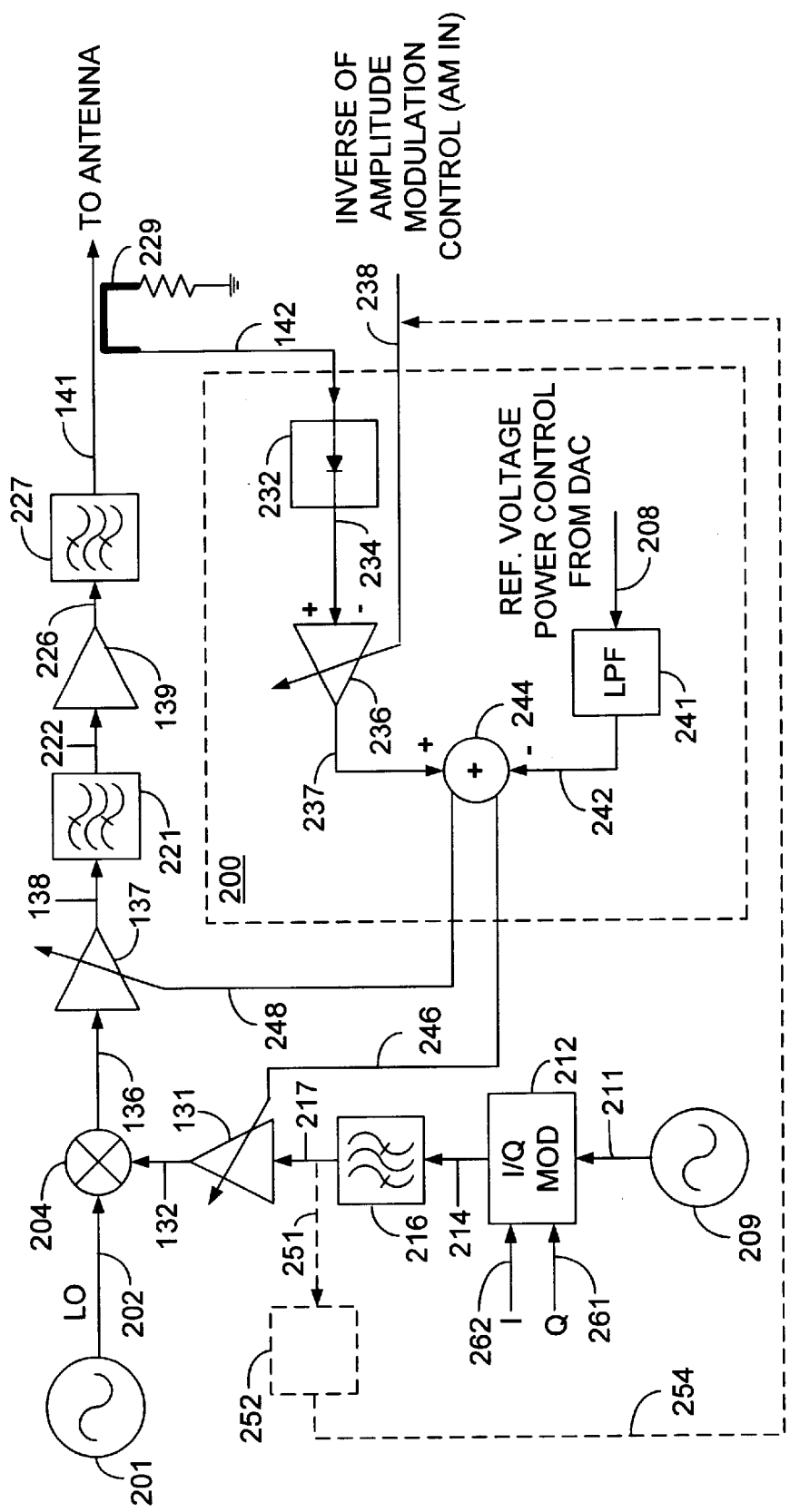
FIG. 2 is a block diagram illustrating the closed power control feedback loop.

FIG. 2 is a block diagram illustrating the closed power control feedback loop system. The closed power control feedback loop system includes an ultra high frequency (UHF) synthesizer 201 and a very high frequency (VHF) synthesizer 209, which together comprise the synthesizer 143 described above with respect to FIG. 1. VHF synthesizer 209 supplies an IF reference signal via connection 211 to I/Q modulator 212. I/Q modulator 212 can be any modulator in which a baseband in-phase (I) component and a quadrature (Q) component are modulated. The baseband I and Q signals are phase modulated (PM) and amplitude modulated (AM) by I/Q modulator 212. Baseband I and Q signals carrying phase and amplitude information are received from DAC 117 of FIG. 1 via connection 262 and 261, respectively. I/Q modulator 212 is one possible implementation of the modulator 127 of FIG. 1.

I/Q modulator 212 supplies a modulated signal containing both a PM component and an AM component on connection 214 to IF saw filter 216. IF saw filter 216 rejects the unnecessary components of the PM and AM signal on connection 214 and supplies a filtered version of the combined AM and PM IF signal on connection 217. The signal on connection 217 containing both the PM component and the AM component is then supplied to IF VGA 131. The gain of IF VGA 131 is set at a specific level while transmitting. To accomplish this, a wide range of output levels is required, thus necessitating a variable gain amplifier. The output of IF VGA 131 on connection 132 is an amplified IF modulated signal containing both a PM component and an AM component.

UHF synthesizer 201 supplies a local oscillator reference frequency on connection 202 to upconverter/mixer 204. The output of IF VGA 131 is also supplied to upconverter/mixer 204. Upconverter/mixer 204 upconverts and mixes the signals on connections 132 and 202, so as to provide a modulated RF signal on connection 136. The combined modulated RF signal on connection 136 is then supplied to RF VGA 137. The RF VGA 137 amplifies the combined modulated PM and AM signal on connection 136 to provide the appropriate power level on connection 138. Importantly, RF VGA 137 neither adds nor subtracts any modulation to the signal on connection 136.

The output of RF VGA 137 is supplied via connection 138 to TX saw filter 221, that removes any unwanted mixing products caused by upconverter/mixer 204. The output of TX saw filter 221 on connection 222 is a fully modulated combined signal containing both a PM component and an AM component. This fully modulated signal on connection 222 is then supplied to power amplifier 139. Because the signal supplied to power amplifier 139 contains both a PM component and an AM component, the power amplifier 139 may operate as close to perfectly linear as possible. Unfortunately, linear amplifiers are highly inefficient, thus consuming valuable power and shortening the life of the battery or other power source of the portable transceiver. If power amplifier 139 operates in a non-linear region, then a portion of the AM component of the combined modulated signal on connection 222 will be converted to the PM component, commonly known as AM-to-PM conversion. Therefore, it is preferable that power amplifier 139 be as linear as possible.

It is desirable to provide a closed loop feedback control system for the power amplifier 139, even though the power amplifier 139 is amplifying a combined signal containing both a PM component and an AM component. In the past, in systems where a combined signal is amplified, power control is achieved using an open loop power control system. In such an open loop power control system, a power control reference signal is received by the portable transceiver 100 from a base station (not shown) it is communicating with. It is desirable to have a single portable communication device architecture that can function in communication systems in which both an AM and a PM component are present at the input to the power amplifier (using open loop power control) and that can function in situations in which only a PM component is present at the input to the power amplifier (using closed loop power control). A closed loop power control feedback system is incorporated into the portable transceiver 100 to control output power. Unfortunately, when a closed loop power control system is implemented in such an arrangement, the closed feedback loop tends to cancel the AM component of the transmit signal. For example, the output of power amplifier 139 on connection 226 is an amplified signal containing both the PM component and the AM component. This signal is filtered through output filter 227 and supplied on connection 141 to the antenna 146 of FIG. 1. Coupler 229 removes a small portion of the output power on connection 141. This small portion contains both a PM component and an AM component. In a conventional closed loop feedback control system, the closed loop power control feedback system, by attempting to control the output power on connection 141, would necessarily remove the AM component of the transmit signal.

To prevent the closed loop power control feedback system from canceling the AM component of the transmit signal, an inverse version of the AM component of the transmit signal is applied through a variable gain element into the feedback loop. Specifically, the output of coupler 229 is supplied via connection 142 to logarithmic detector 232. Logarithmic detector 232 takes the RF energy on connection 142 and supplies, on connection 234, a DC signal representing the level of the power present on connection 142. In this manner, the output of log detector 232 is supplied to variable gain element 236. An inverse version of the AM component of the desired transmit signal is also supplied via connection 238 to variable gain element 236. This signal can be supplied from the DAC 117 of FIG. 1, or optionally can be supplied by a variable gain element 252 located at the output of IF saw filter 216 and shown in dotted line to indicate that it is optional. In this manner, the output of variable gain element 236 on connection 237 is supplied to comparator 244.

A reference voltage power control signal from the DAC 117 of FIG. 1 is supplied via connection 208 to low pass filter (LPF) 241. Low pass filter 241 has the characteristic that allows the desired power level signal supplied on connection 208 to pass via connection 242 to comparator 244. Without the addition of an inverse of the AM signal to the variable gain element 236, the comparator 244 will merely be comparing a steady state reference voltage on connection 242 with the amplitude varying signal that would be supplied by variable gain element 236 on connection 237. In the power control system 200, the comparator 244 attempts to match the amplitude varying signal on connection 237 with the steady state signal on connection 242, thus canceling the AM component within the power control loop. However, the inverse of the desired AM signal is supplied via connection 238 to the control input of variable gain element 236.

Comparator 244 compares the output of the variable gain element 236 with the output of low pass filter 241 on connection 242 in order to provide a pair of gain control signals on connections 246 and 248, respectively. The gain control signal on connection 246 is supplied to IF VGA 131 and the gain control signal on connection 248 is supplied to RF VGA 137. In this manner, the output power of the IF VGA 131 and the RF VGA 137 is controlled, while preventing the closed loop power control feedback system from canceling the AM component present at the output 226.

To illustrate the operation of an aspect of the invention, assume that the output of log detector 232 indicates that the power output on connection 141 goes up by 1 dB. Accordingly, the variable gain amplifier 236 will bring that output down by 1 dB. In this manner, the feedback control loop ignores the AM component of the signal on connection 141. By injecting an inverse version of the AM component into variable gain element 236 as illustrated in FIG. 2, the output of variable gain element 236 on connection 237 will remain constant, thus preventing the feedback control loop from canceling the AM component of the signal on connection 141. Preferably, the output of variable gain element 236 remains constant. The gain of variable gain element 236 is varied inversely proportional to the AM signal supplied on connection 141.

Alternatively, the modulated IF signal on connection 217 can be supplied to log detector 252 via connection 251. The output of log detector 252 can be directed to connection 238, where it is used to supply the inverse AM component. In such an implementation, log detector 232 would be omitted. The gain control signals on connections 246 and 248, respectively, keep the gain of the AM component constant through IF VGA 131 and RF VGA 137. Although not shown as being a variable amplifier, power amplifier 139, in an alternative embodiment, can be combined with RF VGA 137.

Figure 3:
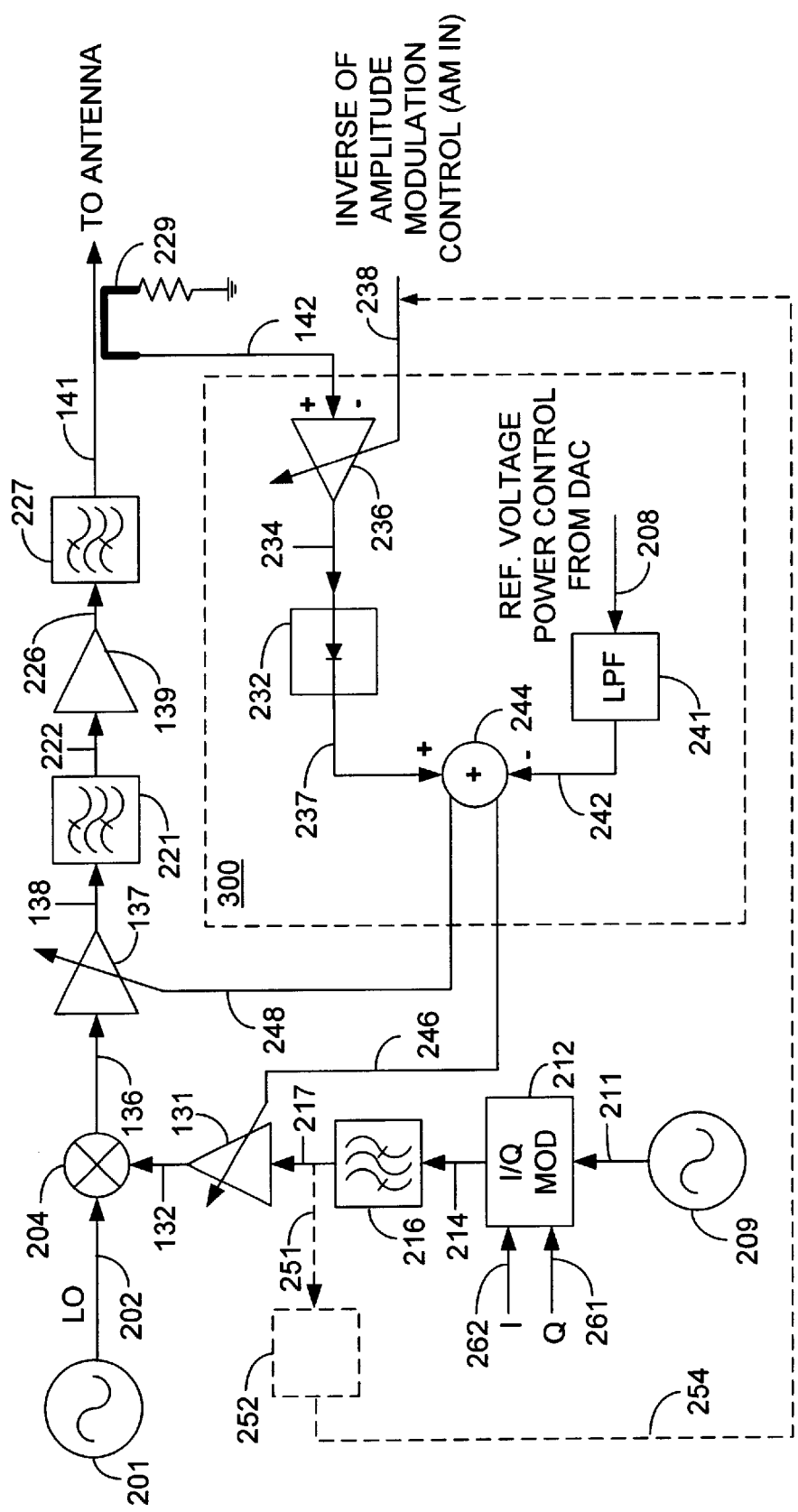
FIG. 3 is a block diagram illustrating another aspect of the closed power control feedback loop of FIG. 2.

FIG. 3 is a block diagram illustrating another aspect of the closed power control feedback loop system of FIG. 2. In the closed power control feedback loop system 300 of FIG. 3, the order of the variable gain element 236 and the log detector 232 are reversed. In the embodiment described in FIG. 3, coupler 229 directs a portion of the transmit signal on connection 141 via connection 142 to variable gain element 236. Variable gain element 236 receives as a control signal via connection 238 the inverse of the AM portion of the combined modulated signal present on connection 141. The output of variable gain element 236 is supplied on connection 234 to log detector 232. Log detector 232 receives the RF energy on connection 234 and supplies, on connection 237, a DC reference voltage corresponding to the power level present on connection 142. The operation of the balance of the system shown in FIG. 3 is the same as described with respect to FIG. 2.

While various embodiments of the invention have been described, it will be apparent to those of ordinary skill in the art that many more embodiments and implementations are possible that are within the scope of this invention. For example, while illustrated using an I/Q modulator, the invention can work with any modulation technique. Accordingly, the invention is not to be restricted except in light of the attached claims and their equivalents.

What is claimed is:

1. A system for closed loop power control in a phase and amplitude modulated transmission environment, comprising:
    a first amplifier configured to amplify a first modulated signal and a second modulated signal;
    an upconverter configured to upconvert the first modulated signal and the second modulated signal to form a combined modulated signal;
    a second amplifier configured to amplify the combined modulated signal;
    a power amplifier configured to amplify the combined modulated signal;
    a power detector located in a closed power control feedback loop, the power detector configured to detect a portion of an output of the power amplifier;
    a comparator configured to adjust the output power of the first amplifier and the second amplifier based upon the difference between the detected portion of the output of the power amplifier and a reference signal; and
    a variable gain element configured to inject an inverse of the second modulated signal into the feedback loop.

2. The system of claim 1, wherein the variable gain element is an amplifier.

3. The system of claim 1, wherein the variable gain element is an attenuator.

4. The system of claim 1, wherein the first modulated signal is a phase modulated signal.

5. The system of claim 1, wherein the second modulated signal is an amplitude modulated signal.

6. The system of claim 1, wherein the variable gain element operates on a radio frequency (RF) signal.

7. The system of claim 1, wherein the variable gain element operates on a baseband signal representing the radio frequency (RF) power level of the output power of the power amplifier.

8. The system of claim 1, wherein the first amplifier is an intermediate frequency (IF) variable gain amplifier.

9. The system of claim 1, wherein the second amplifier is a radio frequency (RF) variable gain amplifier.

10. A system for controlling to power output of a portable communication device, comprising:
    a mixer configured to provide a combined modulated signal, the combined modulated signal including a first component and a second component;
    a detector located in a feedback loop, the detector configured to detect a portion of an output power of the combined modulated signal;
    a comparator configured to adjust the output power based upon the difference between the detected portion of the output power and a reference signal; and
    a variable gain element configured to inject a second modulated signal into the feedback loop, the second modulated signal being an inverse of the second component of the combined modulated signal.

11. The system of claim 10, wherein the variable gain element is an amplifier.

12. The system of claim 10, wherein the variable gain element is an attenuator.

13. The system of claim 10, wherein the first component is phase modulated.

14. The system of claim 10, wherein the second component is amplitude modulated.

15. The system of claim 10, wherein the variable gain element operates on a radio frequency (RF) signal.

16. The system of claim 10, wherein the variable gain element operates on a baseband signal representing the radio frequency (RF) power level of the output power of the power amplifier.

17. The system of claim 10, wherein the combined modulated signal is amplified by an intermediate frequency (IF) variable gain amplifier.

18. The system of claim 10, wherein the second modulated signal is amplitude modulated.

* * * * *